(12) United States Patent
Yuan

(10) Patent No.: US 7,446,558 B2
(45) Date of Patent: Nov. 4, 2008

(54) HIGH SPEED IO BUFFER

(75) Inventor: Jao Che Yuan, Hsinchu (TW)

(73) Assignee: Mediatek Inc., Hsin-Chu (TW)

(*) Notice: Subject to any disclaimer, the term of this patent is extended or adjusted under 35 U.S.C. 154(b) by 0 days.

(21) Appl. No.: 11/529,893

(22) Filed: Sep. 29, 2006

(65) Prior Publication Data

US 2008/0079457 A1  Apr. 3, 2008

(51) Int. Cl.
*H03K 19/003* (2006.01)
(52) U.S. Cl. .................................. 326/30; 326/86
(58) Field of Classification Search .............. 326/86, 326/30; 327/108
See application file for complete search history.

(56) References Cited

U.S. PATENT DOCUMENTS

| | | | |
|---|---|---|---|
| 5,162,672 A | 11/1992 | McMahan et al. | |
| 6,624,662 B1 * | 9/2003 | Volk | 326/87 |
| 6,690,191 B2 * | 2/2004 | Wu et al. | 326/30 |
| 6,853,213 B2 * | 2/2005 | Funaba | 326/30 |
| 6,856,164 B2 | 2/2005 | Park et al. | |
| 6,930,508 B2 * | 8/2005 | Kim et al. | 326/30 |

OTHER PUBLICATIONS

Aklra Kotabe, Kenichi Osada, Naoki Kitai, Mio Fojioka, Shiro Kamohara, Mosahiro Moniwa, Sadayuki Morita, and Yoshikazu Saitoh; A Low Power Four-Transistor SRAM Coil With a Stacked Vertical Poly-Silicon PMOS and a Dual-Word-Voltage Scheme; IEEE Journal of Solid-State Circuits; Apr. 2005; vol. 40, No. 4; pp. 570-576.

Changsik Yoo, Kye-Hyun Kyung, Kyunam Lim, Hi-Choon, Lee, Joon-Won Chai, Nak-Won Heo, Dong-Jin Lee, and Chang-Hyun Kim; A 1.8V 700Mb/s/pin 512-Mb DDR-II SDRAM With On-Die Termination and Off-Chip Driver Calibration; IEEE Journal of Soid-State Circuits; Jun. 2004; vol. 39, No 6: pp. 941-951.

* cited by examiner

*Primary Examiner*—Vibol Tan
(74) *Attorney, Agent, or Firm*—Thomas, Kayden, Horstemeyer & Risley LLP

(57) ABSTRACT

A bi-directional buffer is provided. The buffer includes a driver, a receiver, and a circuitry configured to select a driving mode in response to detecting a first condition and to select a receiving mode in response to detecting a second condition. The driving mode has a first impedance and the receiving mode has a second impedance. The second impedance is partially contributed from the driver.

11 Claims, 11 Drawing Sheets

Configuration 1    Configuration 2

Pull-up Resistor

Configuration 1    Configuration 2

Pull-down Resistor

# HIGH SPEED IO BUFFER

BACKGROUND OF THE INVENTION

1. Field of the Invention

This invention relates generally to communication systems. More particularly, this invention is related to transceivers in communication systems.

2. Description of the Prior Art

For a high-speed IO buffer, there are I-V curve (or impedance) characteristic requirements for both a driving mode and a receiving mode. FIG. 1 shows a conventional IO buffer 100. The IO buffer 100 includes a driver 102 and a receiver 104. A control unit 112 is used to assert or negate transistor Q1, Q2, Q3, and Q4 in response to the Data and OE signals.

In the driving mode, OE (data output enable) is asserted. Transistors Q3 and Q4 are off. When a logic state 1 (Data) is to be outputted though node 106, transistor Q1 is on and transistor Q2 is turned off to pull high the node 106. When a logic state 0 (Data) is to be outputted through node 106, transistor Q1 is turned off and Q2 is turned on to pull low the node 106. In the receiving mode, OE (data output enable) is negated. Both transistors Q1 and Q2 are off and transistors Q3 and Q4 are turned on.

FIG. 2A shows an I-V diagram of transistor Q2 for a driving mode. FIG. 2B shows an I-V diagram of transistor Q1 for a driving mode. There may be different requirements for different applications. For example, in a driving mode for a specific application, the I-V curve 202 of transistor Q2 is required to be designed between a maximum curve 205 and a minimum curve 206. Similarly, the I-V curve 204 of transistor Q1 is required to be designed between a maximum curve 207 and a minimum curve 208.

FIG. 2C shows an I-V diagram of transistor Q3 for a receiving mode. FIG. 2D shows an I-V diagram of transistor Q4 for a receiving mode. For the receiving mode, the impedance of the receiver 104 is required to match that of the transmission line 114 coupled to node 106. The I-V curve 211 of transistor Q3 is required to be linear and between a maximum curve 210 and minimum curve 212. The I-V curve 214 of transistor Q4 is required to be linear and between a maximum curve 214 and minimum curve 216.

Because the driving mode and the receiving mode have different requirements, they are conventionally designed separately in an IO buffer. The area is thus larger and the IO buffer is less flexible for different applications where different impedance and linearity (constant impedance) requirements are needed. Therefore, there is a need for a new IO buffer that can reduce area and increase flexibility.

SUMMARY OF THE INVENTION

To solve the aforementioned problem, this invention provides an IO buffer for driving and receiving operations. The driver and the receiver in the IO buffer share their impedance in both the driving mode and the receiving mode. Because the circuitries in both the driver and the receiver are efficiently used and shared, the area of the IO buffer is decreased compared with prior arts.

One preferred embodiment according to this invention is a bi-directional buffer. The bi-directional buffer includes a driver, a receiver, and a circuitry configured to select a driving mode in response to detecting a first condition and to select a receiving mode in response to detecting a second condition. The driving mode has a first impedance and the receiving mode has a second impedance. The second impedance is partially contributed from the driver.

The advantage and spirit of the invention may be understood by the following recitations together with the appended drawings.

BRIEF DESCRIPTION OF THE APPENDED DRAWINGS

FIG. 1 shows a conventional IO buffer.

FIG. 2A and FIG. 2B respectively show an I-V diagram of transistors Q1 and Q2 for a driving mode.

FIG. 2C and FIG. 2D respectively show an I-V diagram of transistors Q3 and Q4 for a receiving mode.

Figure 6:
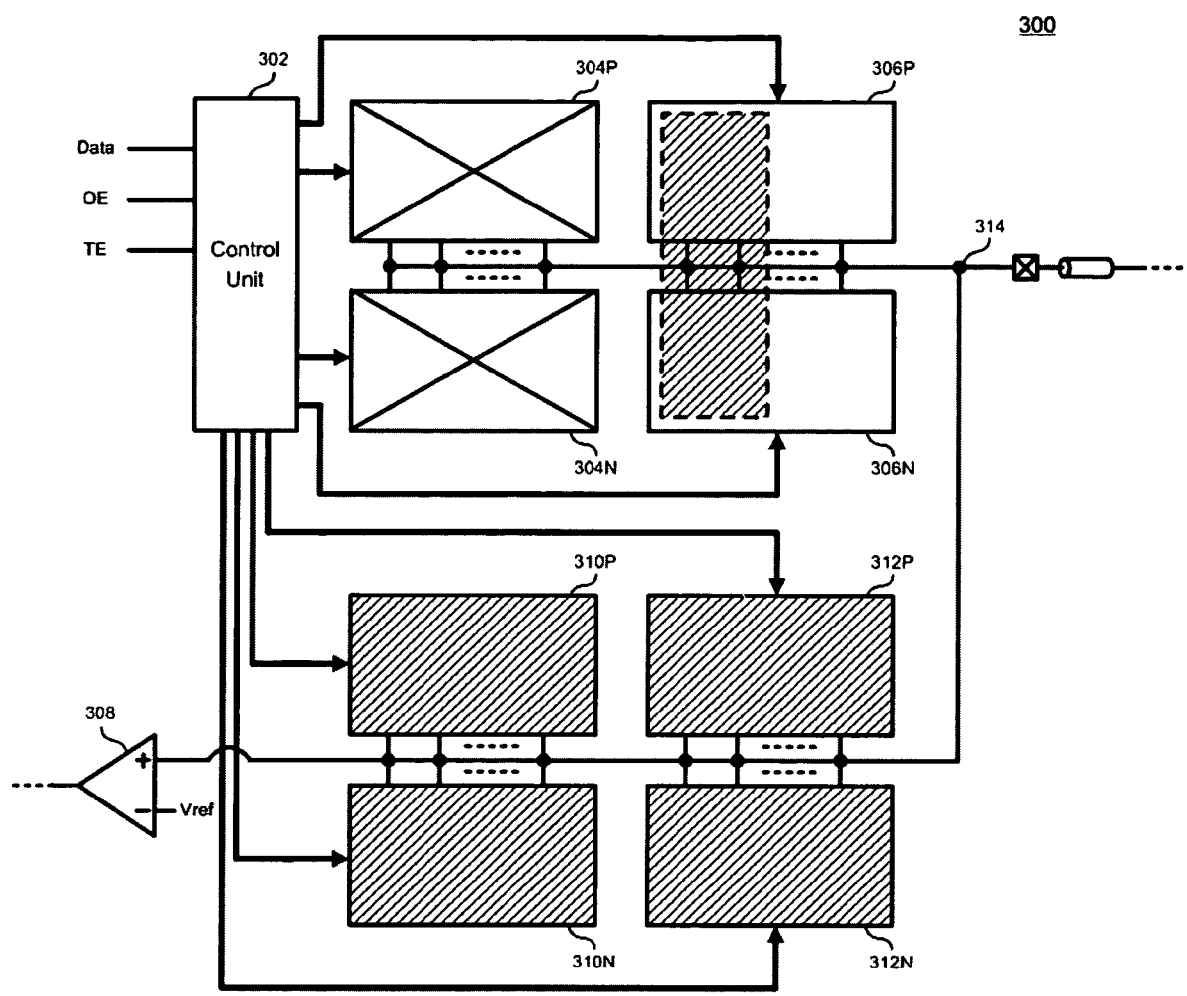
Figure 7:
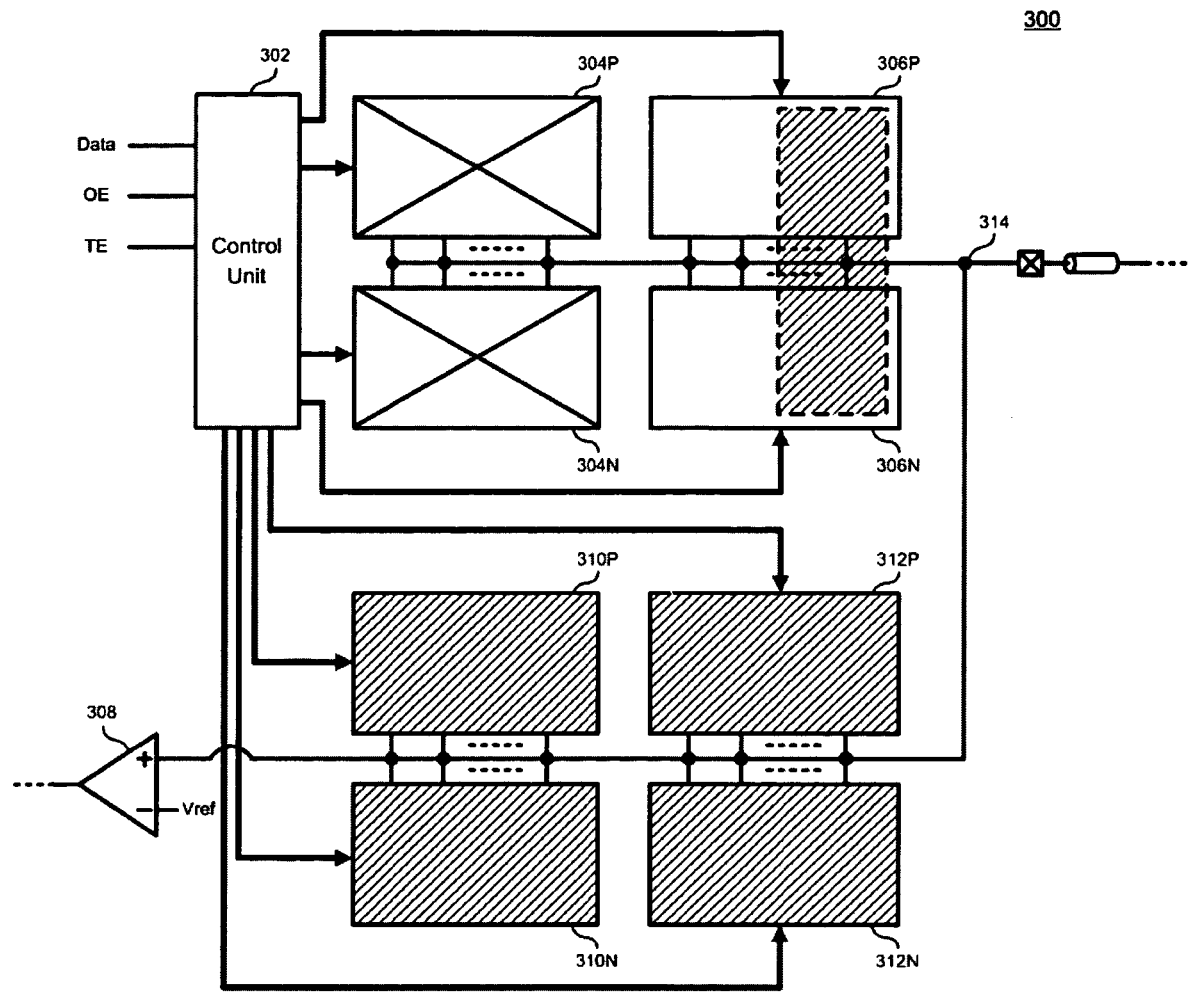
Figure 8:
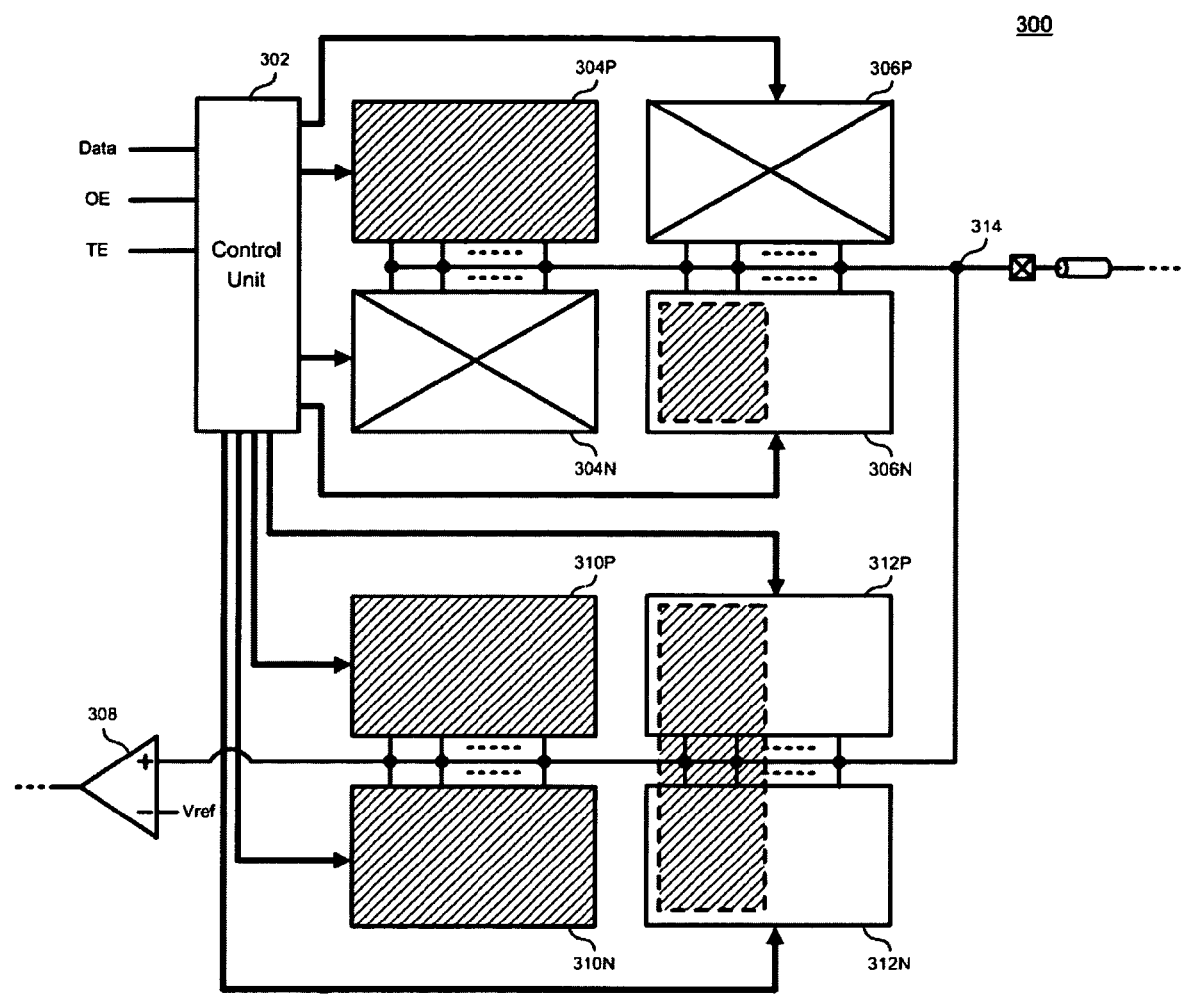

FIG. 6, FIG. 7, and FIG. 8 show examples for the receiving mode.

Figure 9A:
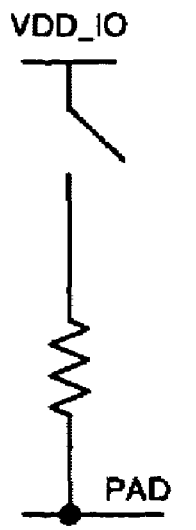
Figure 9A:
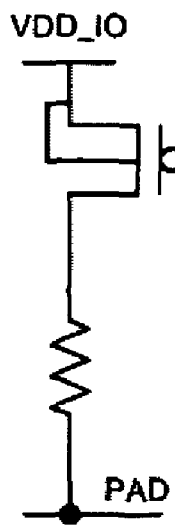
Figure 9A:
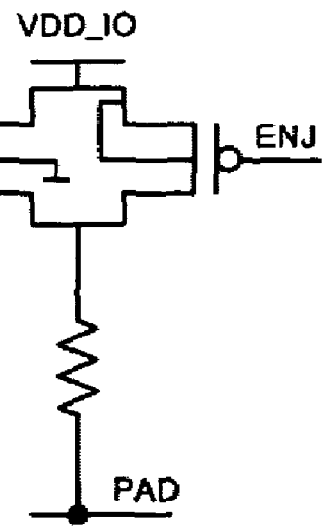
Figure 9B:
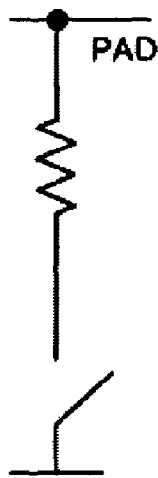
Figure 9B:
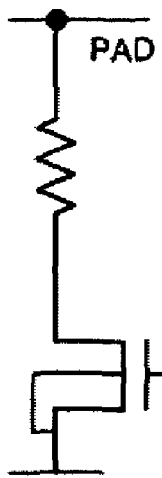
Figure 9B:
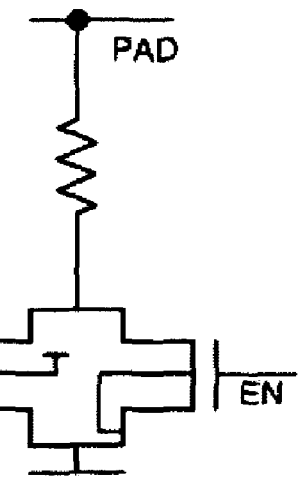

FIGS. 9A and 9B show examples of switches and resistive elements.

Figure 10:
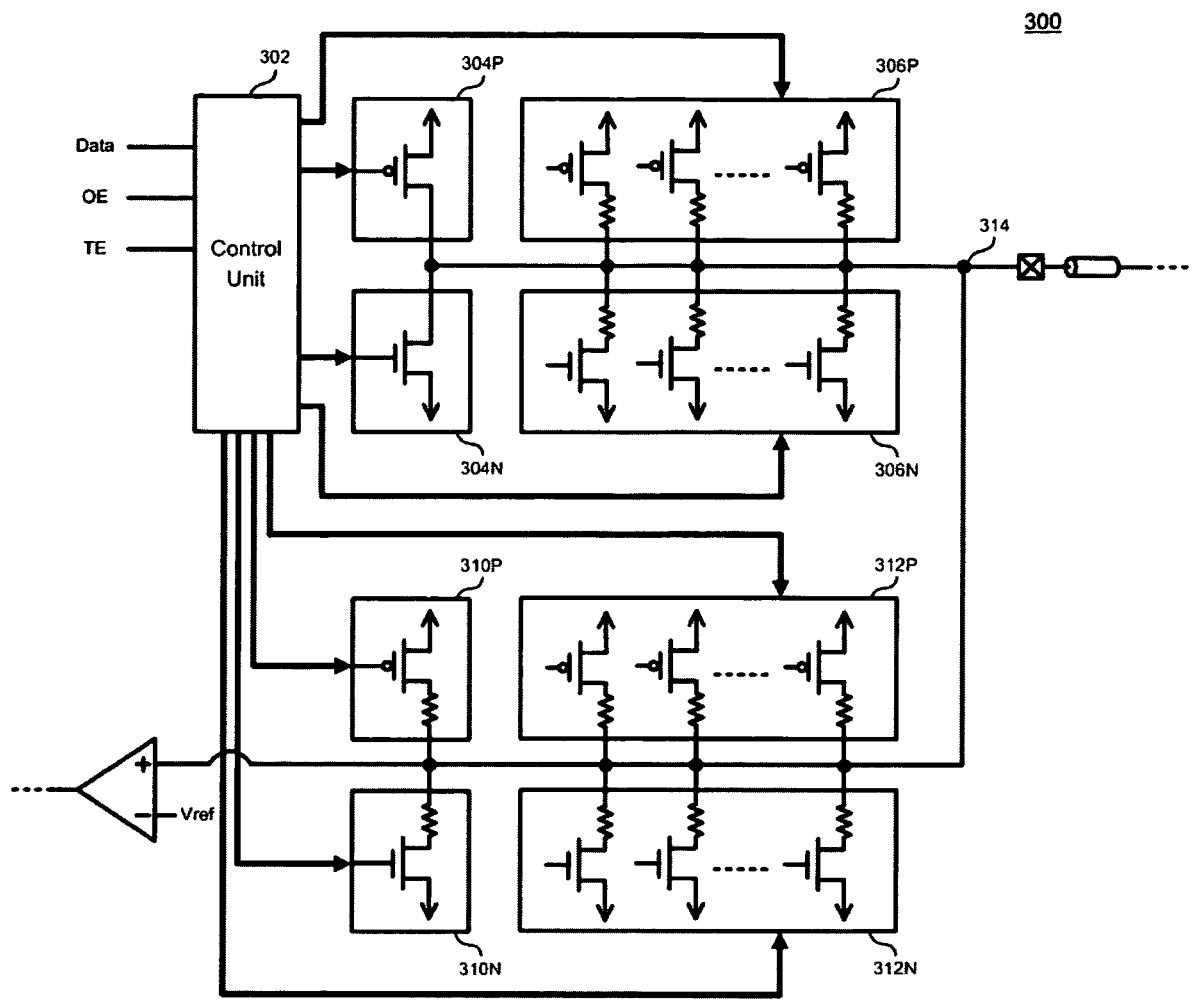

FIG. 10 shows an example of applying different types of configurations in the IO buffer 300.

DETAILED DESCRIPTION OF THE INVENTION

Figure 1:
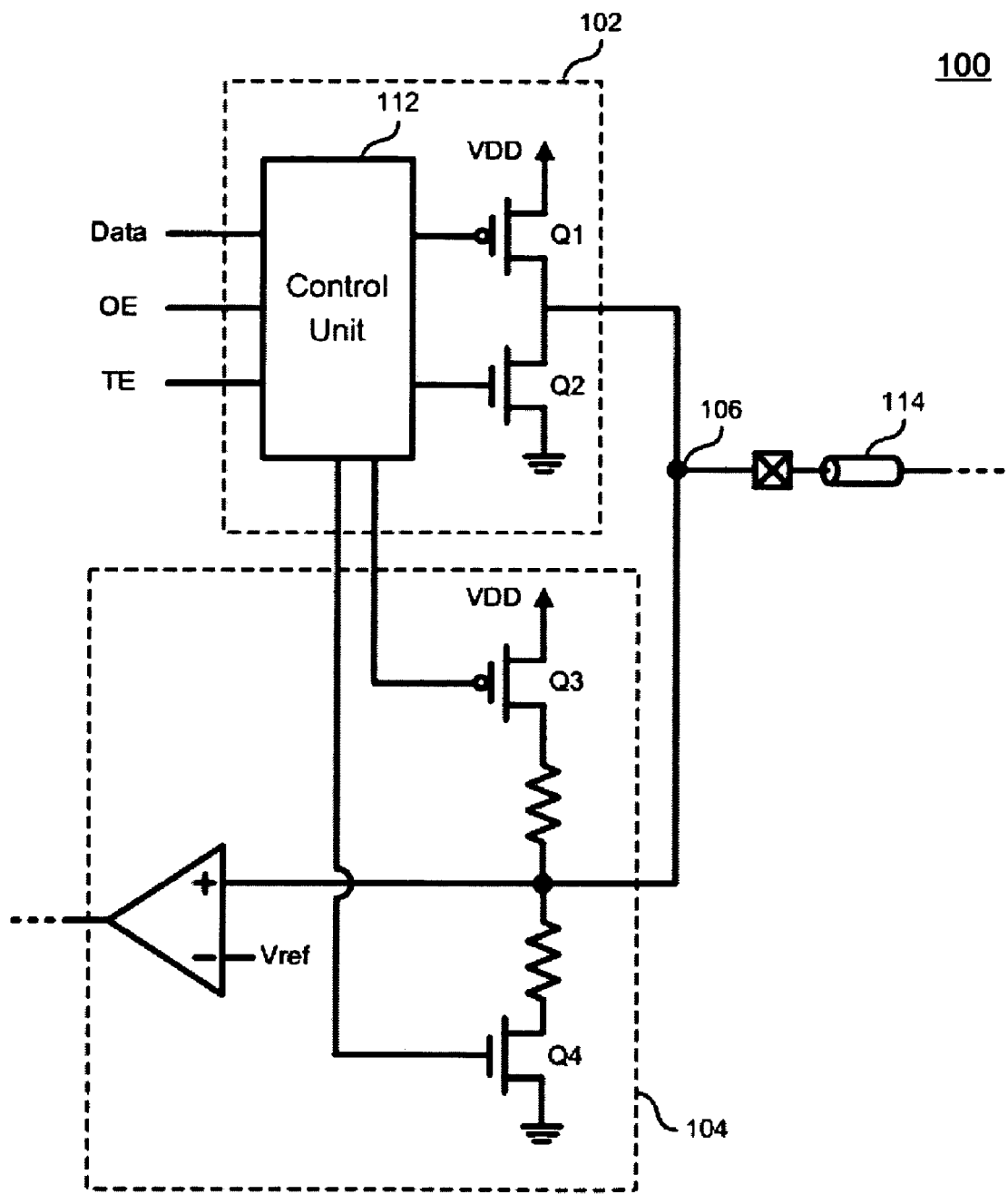
Figure 2A:
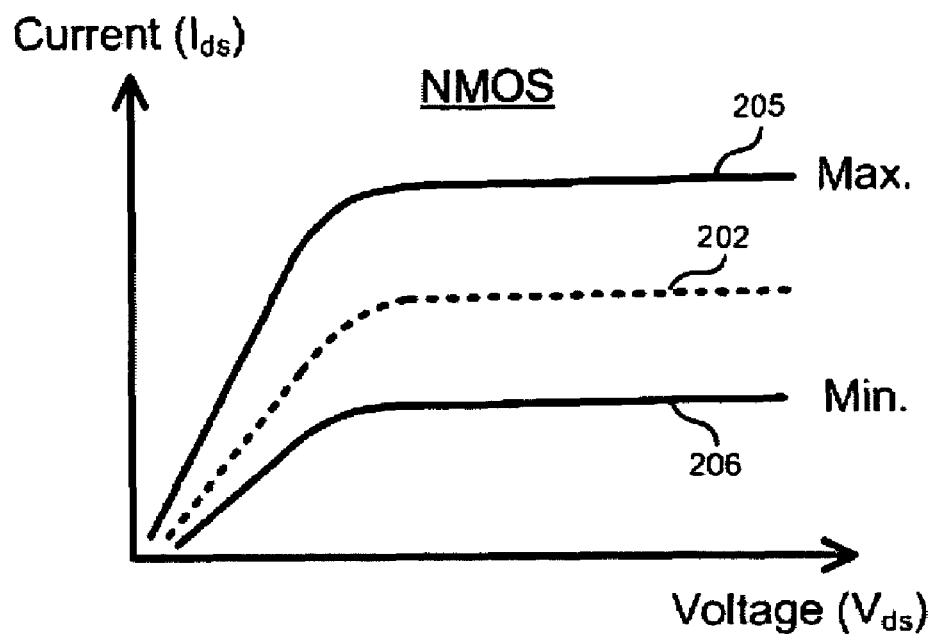
Figure 2B:
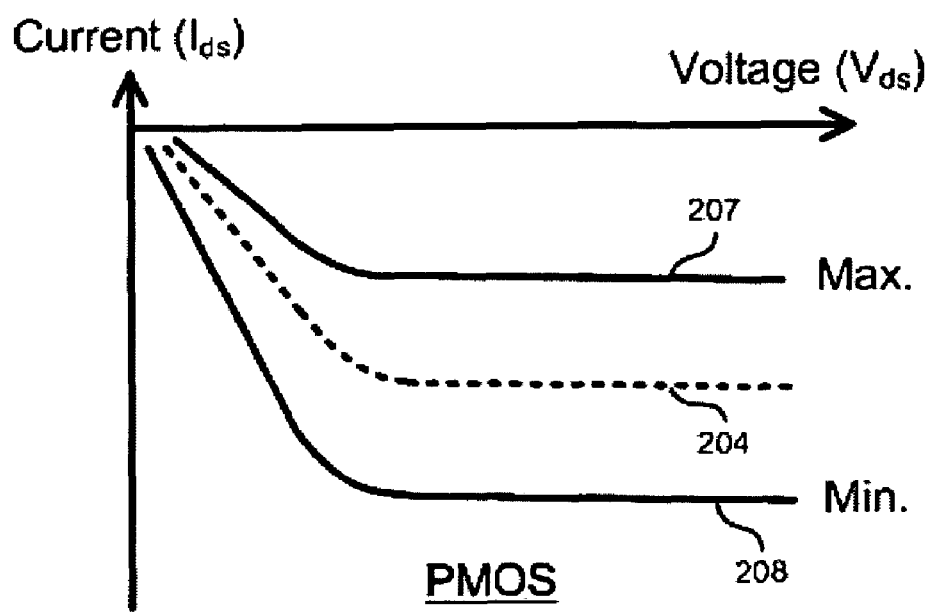
Figure 2C:
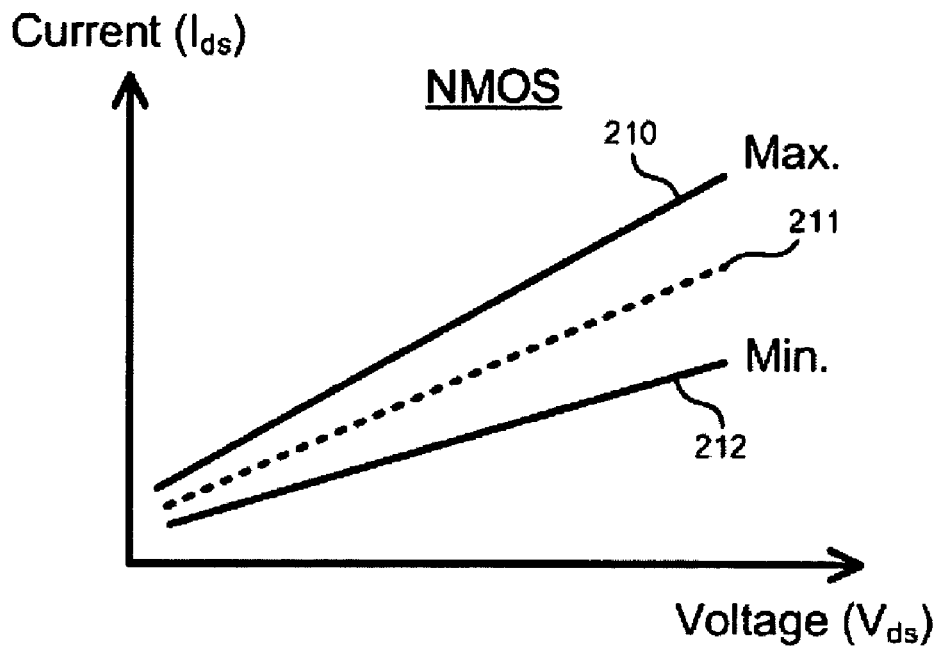
Figure 2D:
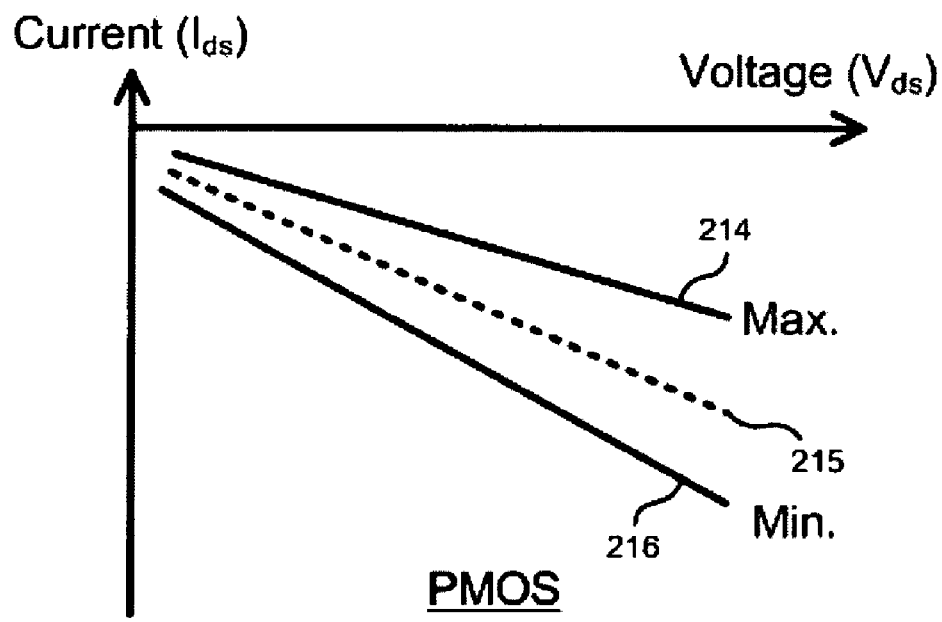
Figure 3:
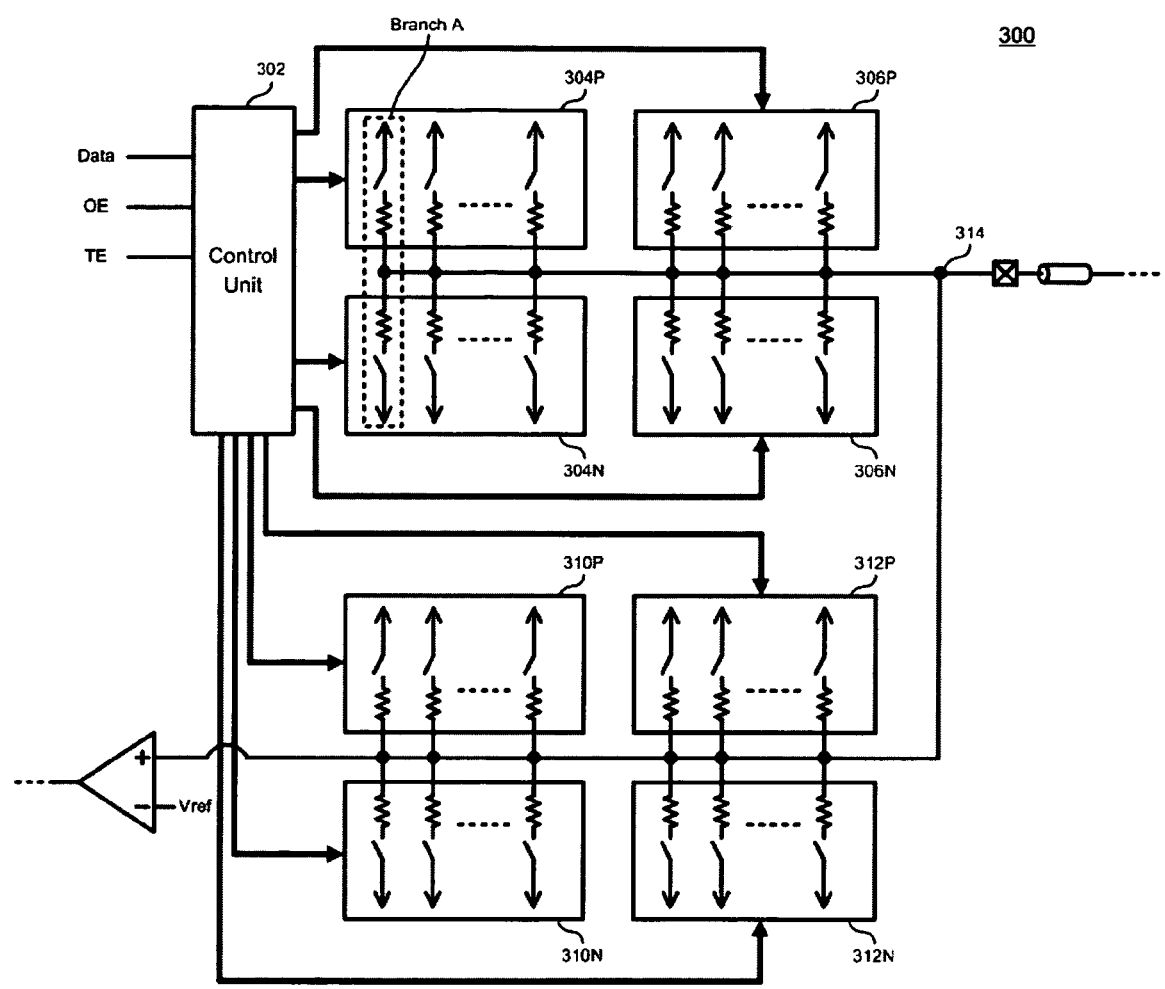
FIG. 3 shows an IO buffer according to one embodiment of this invention.

FIG. 3 shows an IO buffer according to one embodiment of this invention. The IO buffer 300 includes a driver and a receiver. The driver includes base portions 304P, 304N and programmable portions 306P, 306N. The base portion 304P includes a plurality of switch elements ($S_{TX\_b\_P\_1}$, $S_{TX\_b\_P\_2}$, ..., $S_{TX\_b\_P\_n}$) and resistive elements ($R_{TX\_b\_P\_1}$, $R_{TX\_b\_P\_2}$, ..., $R_{TX\_b\_P\_n}$). The base portion 304N includes a plurality of switch elements ($S_{TX\_b\_N\_1}$, $S_{TX\_b\_N\_2}$, ..., $S_{TX\_b\_N\_n}$) and resistive elements ($R_{TX\_b\_N\_1}$, $R_{TX\_b\_N\_2}$, ..., $R_{TX\_b\_N\_n}$). The switch elements can be MOS transistors and the resistive elements can be resistors. However, other components that can serve as switches and resistive elements can be used. The programmable portion 306P includes a plurality of switch elements ($S_{TX\_p\_P\_1}$, $S_{TX\_p\_P\_2}$, ..., $S_{TX\_p\_P\_m}$) and resistive elements ($R_{TX\_p\_P\_1}$, $R_{TX\_p\_P\_2}$, ..., $R_{TX\_p\_P\_m}$). The programmable portion 306N includes a plurality of switch elements ($S_{TX\_p\_N\_1}$, $S_{TX\_p\_N\_2}$, ... $S_{TX\_p\_N\_m}$) and resistive elements ($R_{TX\_p\_N\_1}$, $R_{TX\_p\_N\_2}$, ... $R_{TX\_p\_N\_m}$).

Similarly, the receiver includes base portions 310P, 310N and programmable portions 312P, 312N. The base portion 310P includes a plurality of switch elements ($S_{RX\_b\_P\_1}$, $S_{RX\_b\_P\_2}$, ..., $S_{RX\_b\_P\_n}$) and resistive elements ($R_{RX\_b\_P\_1}$, $R_{RX\_b\_P\_2}$, ..., $R_{RX\_b\_P\_n}$). The base portion 310N includes a plurality of switch elements ($S_{RX\_b\_N\_1}$, $S_{RX\_b\_N\_2}$, ..., $S_{RX\_b\_N\_n}$) and resistive elements ($R_{RX\_b\_N\_1}$, $R_{RX\_b\_N\_2}$, ..., $R_{RX\_b\_N\_n}$). The switch elements can be MOS transistors and the resistive elements can be resistors. However, other components that can serve as switches and resistive elements can be used. The programmable portion 312P includes a plurality of switch elements ($S_{RX\_p\_P\_1}$, $S_{RX\_p\_P\_2}$, ..., $S_{RX\_p\_P\_m}$) and resistive elements ($R_{RX\_p\_P\_1}$, $R_{RX\_p\_P\_2}$, ..., $R_{RX\_p\_P\_m}$). The programmable portion 312N includes a plurality of switch elements ($S_{RX\_p\_N\_1}$, $S_{RX\_p\_N\_2}$, ..., $S_{RX\_p\_N\_m}$) and resistive elements ($R_{RX\_p\_N\_1}$, $R_{RX\_p\_N\_2}$, ..., $R_{RX\_p\_N\_m}$).

Taking branch A as an example, the branch A comprises $S_{TX\_b\_P\_1}$, $R_{TX\_b\_P\_1}$, $R_{TX\_b\_N\_1}$, and $S_{TX\_b\_N\_1}$ connected serially from VDD to GND. The control unit 302 controls the operation of $S_{TX\_b\_P\_1}$ and $S_{TX\_b\_N\_1}$ and determines the equivalent impedance of the branch A. If $S_{TX\_b\_P\_1}$ is turned on and $S_{TX\_b\_N\_1}$ is turned off, the equivalent impedance of the branch A would be (R ($S_{TX\_b\_P\_1}$)+

$R_{TX\_b\_P\_1}$), where R ($S_{TX\_b\_P\_1}$) denotes the equivalent impedance of $S_{TX\_b\_P\_1}$ when $S_{TX\_b\_P\_1}$ is turned on. If $S_{TX\_b\_P\_P\_1}$ is turned off and $S_{TX\_b\_N\_1}$ is turned on, the equivalent impedance of the branch A would be (R ($S_{TX\_b\_N\_1}$)+$R_{TX\_b\_N\_1}$), where R ($S_{TX\_b\_N\_1}$) denotes the equivalent impedance of $S_{TX\_b\_N\_1}$ when $S_{TX\_b\_N\_1}$ is turned on. If both $S_{TX\_b\_P\_1}$ and $S_{TX\_b\_N\_1}$ are turned on, the equivalent impedance of the branch A would be (R ($S_{TX\_b\_P\_1}$)+$R_{TX\_b\_P\_1}$)||(R ($S_{TX\_b\_N\_1}$)+$R_{TX\_b\_N\_1}$). The operations of other branches are similar.

Table 1 illustrates the control of the IO buffer 300 in different modes according to one embodiment of this invention. In the driving mode (Tx mode) for driving H, Data and OE are at a logic 1 state (H). All switches in the base portion 304P are turned on (en) and all switches in the base portion 304N are turned off (dis). The switches in the programmable portion 306P are programmable. That is, a designer can select any suitable combination of switches of 306P to be turned on. Switches in the programmable portion 306N are all turned off because there is no need to pull low the output signal. Switches in the base portion 310P are all turned on to help to pull high the output signal. Switches in the base portion 310N are all turned off because they are not needed. Switches in the programmable portion 312P are programmable. Switches in the programmable portion 312N are turned off because they are not needed. In this case, the resulting impedance is $R_{304P}||R_{306P<programmable>}||R_{310P}||R_{312P<programmable>}$.

In the driving mode (Tx mode) for driving L, when Data is at a logic 0 (L) state and OE is at a logic 1 state (H), switches in the base portion 304P are turned off and those in the base portion 304N are turned on to pull low the output signal. Switches in the programmable portion 306N are programmable and those in the programmable portion 306P are turned off. Switches in the base portion 310P are turned off and those in the base portion 310N are turned on. Switches in the programmable portion 312P are turned off and those in the programmable portion 312N are programmable. In this case, the resulting impedance is $R_{304N}||R_{306N<programmable>}||R_{310N}||R_{312N<programmable>}$.

In the receiving mode (Rx mode) with termination enabled, when Data is at a "don't care" (X) state, OE is at a logic 0 state (L) and TE (termination enable) is at a logic 1 state (H), switches in the base portion 304P and 304N are turned off. Switches in the programmable portion 306P and 306N are programmable. Switches in the base portion 310P and 310N are turned on. Switches in the programmable portion 312P and 312N are programmable. In this case, the resulting impedance is $R_{306P<programmable>}||R_{306N<programmable>}||R_{310P}||R_{310N}||R_{312P<programmable>}||R_{312N<programmable>}$.

It is noted that the driver and the receiver share their impedance in both the driving mode and the receiving mode. That is, in the driving mode, in addition to the base portions (304P, 304N) and the programmable portions (306P, 306N) of the driver, the base and programmable portions (310P, 310N, 312P, and 312N) of the receiver are also utilized to form a suitable impedance character. In the receiving mode when termination is enabled (TE=H), in addition to the base portion (310P, 310N) and the programmable portion (312P, 312N) of the receiver (terminator), the programmable portions (306P and 306N) of the driver are utilized to form a suitable impedance character. Because the circuitries in both the driver and the receiver are efficiently used and shared, the area of the IO buffer 300 is decreased.

In a High Z mode, Data is at a "don't care (X)" state, OE is at a logic 0 state (L) and TE is at a logic 0 state (H). In this case, all portions (304P, 304N, 306P, 306N, 310P, 310N, 312P, 312N) are disabled (turned off). The output of the IO buffer is at a high impedance state (High Z).

It is also noted that because the driver and the receiver have similar structure (a switch serially connected to a resistive element), they can be easily shared without affecting the impedance characteristic. Conventional driver structure does not include a resistive element connecting to a switch, so it is difficult to share circuit. In other words, conventional drivers are different from receivers in structure, so they cannot be easily shared at the receiving mode when constant impedance (linearity in I-V curve) is required. Sharing circuits between different structures in the receiving mode may seriously affect the constant impedance characteristic (linearity of an I-V curve). Another advantage of the structure (a switch serially connected to a resistive element) is that it can result in a linear I-V curve (Id versus Vds). That is, a constant impedance is formed regardless of Vds and Id if a MOS is used as the switch. The constant impedance can avoid transmission line impedance mismatch effects.

Figure 4:
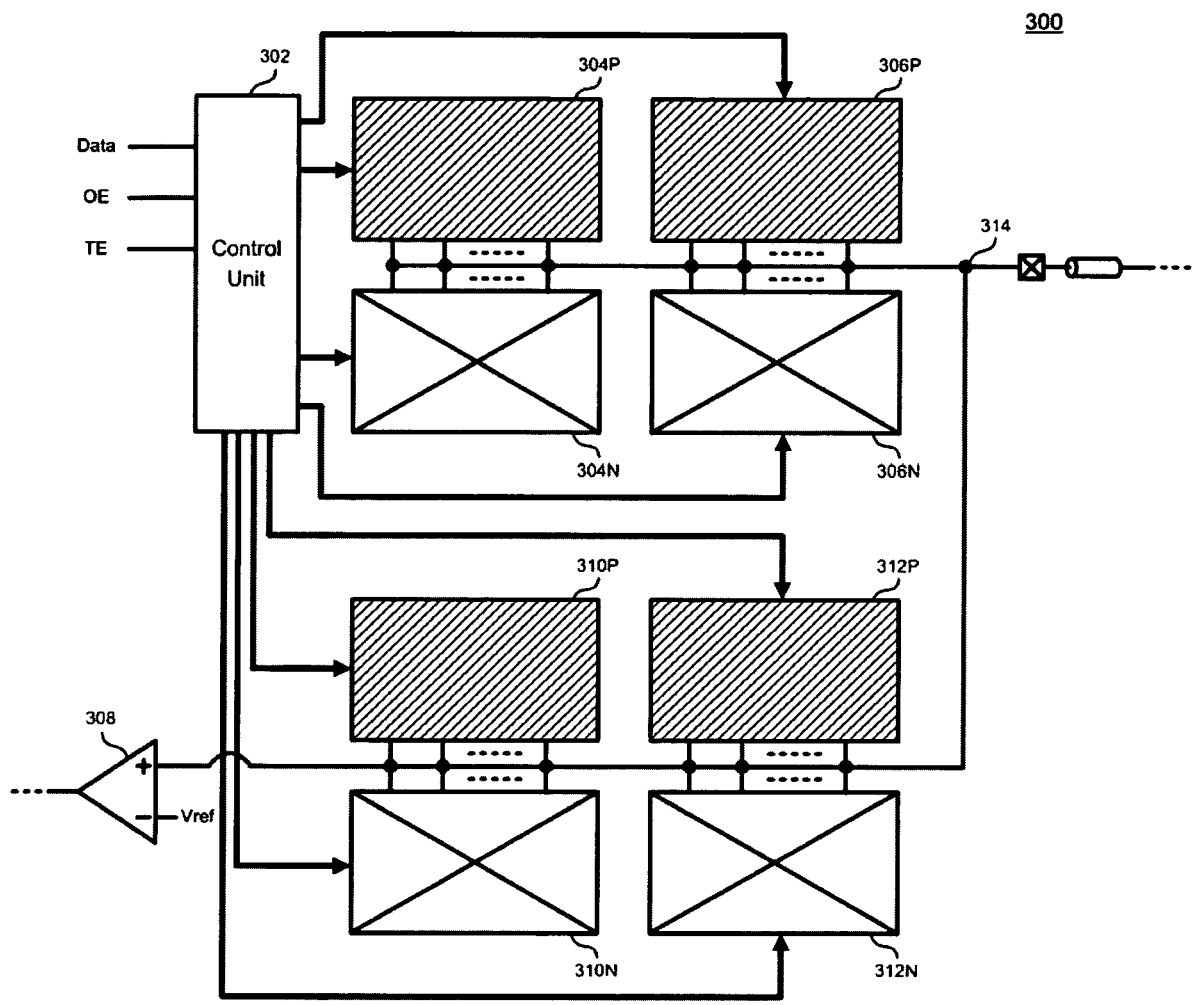
FIG. 4 and FIG. 5 show examples for the driving mode.

FIG. 4 shows an example for the driving mode. In this case, Data is at a logic 1 state (H) and OE is at a logic 1 state (H). A logic 1 state (H) is to be outputted at node 314. The control unit 302 controls the base portions 304P, 304N, the programmable portions 306P, 306N, the base portions 310P, 310N, and the programmable portions 312P, 312N. The switches in the base portions 304P, 310P, and the programmable portions 306P, 312P are all turned on to pull high the node 314. The switches in the base portions 304N, 310N, and the programmable portions 306N, 312N are all turned off. It is noted that in this case the base portion 310P and programmable portion 312P of the receiver contribute to the impedance characteristic and the driving capability of the IO buffer 300. By sharing the base portion 310P and programmable portion 312P, the area needed for the base portion 304P and programmable portion 306P is reduced.

Figure 5:
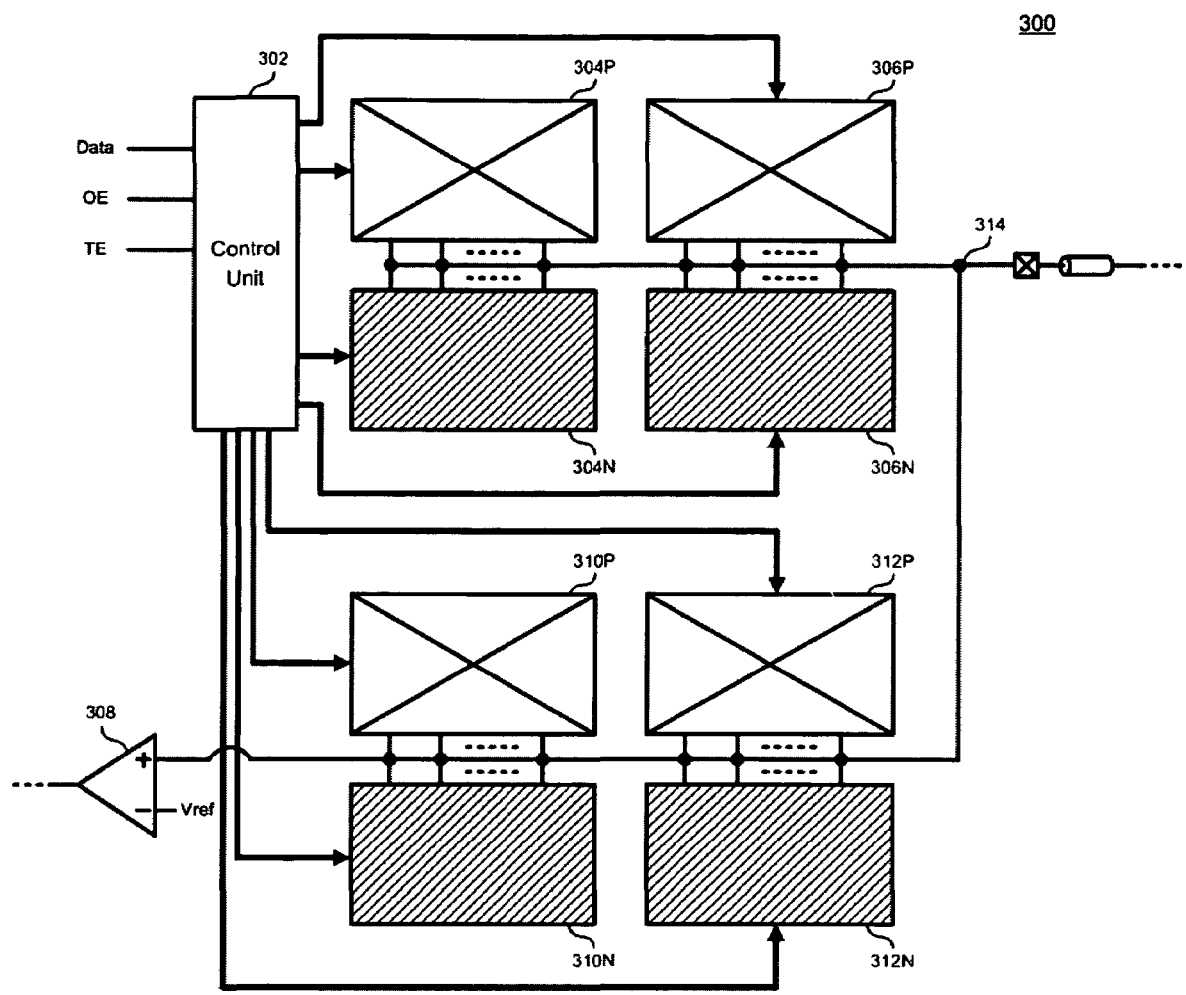

FIG. 5 shows another example for the driving mode. In this case, Data is at a logic 0 state (L) and OE is at a logic 1 state (H). A logic 0 state (L) is to be outputted at node 314. The control unit 302 controls the base portions 304P, 304N, the programmable portions 306P, 306N, the base portions 310P, 310N, and the programmable portions 312P, 312N. The switches in the base portions 304N, 310N, and the programmable portions 306N, 312N are all turned on to pull low the node 314. The switches in the base portions 304P, 310P, and the programmable portions 306P, 312P are all turned off. It is noted that in this case the base portion 310N and programmable portion 312N of the receiver contribute to the impedance characteristic and the driving capability of the IO buffer 300. By sharing the base portion 310N and programmable portion 312N, the area needed for the base portion 304N and programmable portion 306N is reduced.

FIG. 6 shows an example for the receiving mode. In this case, OE is at a logic 0 state (L). A logic state (H or L) is to be inputted from node 314. The control unit 302 controls the base portions 304P, 304N, the programmable portions 306P, 306N, the base portions 310P, 310N, and the programmable portions 312P, 312N. The switches in the base portions 310P, 310N, and the programmable portions 312P, 312N are all turned on. The switches in the base portions 304P, 304N are all turned off. The switches in the programmable portions 306P, 306N are partially turned on (the shaded area). However, in other embodiments, portions 312P, 312N need not be all turned on because they are programmable. The portions 304P and 304N need not be turned off because they can be selected to be turned on if required. The portions 310P and 310N need not be turned on because they can be selected to be turned off if required. It is noted that in this case the programmable portions 306P and 306N of the driver contribute to the impedance characteristic of the IO buffer 300 in the receiving mode. By sharing the shaded programmable portions 306P and 306N, the area needed for the programmable portions 312P and 312N is reduced.

FIG. 7 shows another example for the receiving mode. In this case, OE is at a logic 0 state (L). A logic state (H or L) is to be inputted from node 314. The control unit 302 controls the base portions 304P, 304N, the programmable portions 306P, 306N, the base portions 310P, 310N, and the programmable portions 312P, 312N. The switches in the base portions 310P, 310N, and the programmable portions 312P, 312N are all turned on. The switches in the base portions 304P, 304N are all turned off. The switches in the programmable portions 306P, 306N are partially turned on (the shaded area). However, in other embodiments, portions 312P, 312N need not be all turned on because they are programmable. The portions 304P and 304N need not be turned off because they can be selected to be turned on if required. The portions 310P and 310N need not be turned on because they can be selected to be turned off if required. It is noted that in this case the programmable portions 306P and 306N of the driver contribute to the impedance characteristic of the IO buffer 300 in the receiving mode. By sharing the shaded programmable portions 306P and 306N, the area needed for the programmable portions 312P and 312N is reduced.

FIG. 8 shows still another embodiment of the IO buffer 300 in a receiving mode. The portion 304P is selected to be turned on and the portion 304N is turned off. Part of the portion 306N is selected to be turned and the portion 306P is turned off. The portions 310P and 310N are selected to be turned on and part of the portions 312P and 312N are turned on. As long as impedance sharing can be achieved, any combination of these portions is acceptable.

FIGS. 9A and 9B show examples of switches and resistive elements. Both configuration (1) (single MOS transistor) and configuration (2) (double MOS transistors) can be used as switches and resistive elements mentioned in FIG. 3. However, the same configuration of switches and resistive elements is recommended to be used in portions with similar function. For example, the base portion 304P and the programmable portion 306P had better use the same configuration of switches and resistive elements. The base portion 304N and the programmable portion 306N had better use the same configuration of switches and resistive elements. The base portion 310P and programmable portion 312P had better use the same configuration of switches and resistive elements. The base portion 310N and the programmable portion 312N had better use the same configuration of switches and resistive elements.

However, different types of configurations of pull-up or pull-down resistors can be selected in different portions if their combination will not affect the impedance sharing function. FIG. 10 shows an example of applying different types of configurations in the IO buffer 300. No resistive element is used in the portion 304P and only MOS switches are used. In the receiving mode for example, the portions 306P, 306N, 310P, 310N, 312P, and 312N are programmable to achieve the impedance sharing function. The portions 304P and 304N are not used in the receiving mode because they don't have resistive elements. Therefore, the impedance of the portions 304P and 304N are not shared in the receiving mode.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

TABLE 1

|  | Data | OE | TE | 304P | 304N | 306P | 306N | 310P | 310N | 312P | 312N |
|---|---|---|---|---|---|---|---|---|---|---|---|
| TX mode | H | H | x | En | Dis | Pro | Dis | En | Dis | Pro | Dis |
|  | L | H | x | Dis | En | Dis | Pro | Dis | En | Dis | Pro |
| RX mode | x | L | H | Dis | Dis | Pro | Pro | En | En | Pro | Pro |
| High-Z mode | x | L | L | Dis | Dis | Dis | Dis | Dis | Dis | Dis | Dis |

What is claimed is:

1. An IO buffer for driving and receiving operations, the buffer comprising:
    a driver, comprising:
        a first switch;
        a first resistive element serially coupled to the first switch;
        a second resistive element coupled to the first resistive element via an output node; and
        a second switch serially coupled to the second resistive element; and
    a receiver, comprising:
        a third switch;
        a third resistive element serially coupled to the third switch;
        a fourth resistive element coupled to the third resistive element via the output node; and
        a fourth switch serially coupled to the fourth resistive element;
    wherein in a receiving mode, at least one of the first and the second switches is turned on.

2. The buffer of claim 1, wherein the first switch, the second switch, the third switch, and the fourth switch respectively comprise at least one transistor.

3. The buffer of claim 2, wherein the transistor is selectively a NMOS or a PMOS.

4. The buffer of claim 1, wherein in a driving mode, if a data with a high logic value is to be outputted at said output node, the first switch and the third switch are turned on, and the second switch and the fourth switch are turned off.

5. The buffer of claim 1, wherein in a driving mode, if a data with a low logic value is to be outputted at said output node, the first switch and the third switch are turned off, and the second switch and the fourth switch are turned on.

6. The buffer of claim 1, wherein in the receiving mode, the first, second, third, and fourth switches are all turned on.

7. The buffer of claim 1, wherein the driver further comprises:
    a programmable driving array, comprising:
        N fifth switches, wherein N is a positive integer;
        N fifth resistive elements, each of the fifth resistive elements being serially coupled to one of the N fifth switches, respectively;

N sixth resistive elements, each of the sixth resistive elements being coupled to one of the N fifth resistive elements via said output node, respectively; and N sixth switches, each of the sixth switches being serially coupled to one of the N sixth resistive elements;

wherein in a driving mode, the N fifth switches and the N sixth switches are programmed to be selectively turned on.

8. The buffer of claim 1, wherein the receiver further comprises:

a programmable receiving array, comprising:

M seventh switches, wherein M is a positive integer;

M seventh resistive elements, each of the seventh resistive elements being serially coupled to one of the M seventh switches, respectively;

M eighth resistive elements, each of the eighth resistive elements being coupled to one of the M seventh resistive elements via said output node, respectively; and M eighth switches, each of the eighth switches being serially coupled to one of the M eighth resistive elements;

wherein in the receiving mode, the M seventh switches and the M eighth switches are programmed to be selectively turned on.

9. A bi-directional buffer comprising:

a driver;

a receiver; and a circuitry configured to:

select a driving mode in response to detecting a first condition, wherein the driving mode has a first impedance; and select a receiving mode in response to detecting a second condition, wherein the receiving mode has a second impedance and the second impedance is partially contributed from the driver and partially contributed from the receiver.

10. The buffer of claim 9, wherein the driver comprises:

a programmable driving array, comprising:

N first switches, wherein N is a positive integer;

N first resistive elements, each of the first resistive elements being serially coupled to one of the N first switches, respectively;

N second resistive elements, each of the second resistive elements being coupled to one of the N first resistive elements via an output node, respectively; and N second switches, each of the second switches being serially coupled to one of the N second resistive elements;

wherein in the receiving mode, the N first switches and the N second switches are programmed to be selectively turned on to form a first part of the second impedance.

11. The buffer of claim 9, wherein the receiver comprises:

a programmable receiving array, comprising:

M third switches, wherein M is a positive integer;

M third resistive elements, each of the third resistive elements being serially coupled to one of the M third switches, respectively;

M fourth resistive elements, each of the fourth resistive elements being coupled to one of the M third resistive elements via an output node, respectively; and M fourth switches, each of the fourth switches being serially coupled to one of the M fourth resistive elements;

wherein in the receiving mode, the M third switches and the M fourth switches are programmed to be selectively turned on to form a second part of the second impedance.

* * * * *

UNITED STATES PATENT AND TRADEMARK OFFICE
CERTIFICATE OF CORRECTION

| | | |
|---|---|---|
| PATENT NO. | : 7,446,558 B2 | Page 1 of 1 |
| APPLICATION NO. | : 11/529893 | |
| DATED | : November 4, 2008 | |
| INVENTOR(S) | : Che Yuan Jao | |

It is certified that error appears in the above-identified patent and that said Letters Patent is hereby corrected as shown below:

On the Title page, item [75] Jao Che Yuan should read --Che Yuan Jao--.

Signed and Sealed this

Twenty-third Day of December, 2008

JON W. DUDAS
*Director of the United States Patent and Trademark Office*